(12) United States Patent
Park et al.

(10) Patent No.: US 11,502,813 B2
(45) Date of Patent: Nov. 15, 2022

(54) CLOCK GENERATOR CIRCUIT AND INTEGRATED CIRCUIT INCLUDING THE SAME

(71) Applicant: SK hynix Inc., Gyeonggi-do (KR)

(72) Inventors: Ji Hwan Park, Gyeonggi-do (KR); Jun Il Moon, Gyeonggi-do (KR); Byung Kuk Yoon, Gyeonggi-do (KR); Myeong Jae Park, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 17/526,870

(22) Filed: Nov. 15, 2021

(65) Prior Publication Data

US 2022/0078003 A1 Mar. 10, 2022

Related U.S. Application Data

(63) Continuation-in-part of application No. 17/009,403, filed on Sep. 1, 2020, now Pat. No. 11,349,466.

(30) Foreign Application Priority Data

Apr. 9, 2020 (KR) .......................... 10-2020-0043459

(51) Int. Cl.
*H03L 7/07* (2006.01)
*H04L 7/00* (2006.01)
*H04L 7/033* (2006.01)
*H03L 7/08* (2006.01)
*H03L 7/081* (2006.01)
(Continued)

(52) U.S. Cl.
CPC ............ *H04L 7/0025* (2013.01); *H03K 5/135* (2013.01); *H03L 7/07* (2013.01); *H03L 7/0807* (2013.01);
(Continued)

(58) Field of Classification Search
CPC ...... H02J 7/0013; H02J 7/0029; H02J 7/0042; H02J 7/345
(Continued)

(56) References Cited

U.S. PATENT DOCUMENTS 7,772,898 B2   8/2010   Cheung
8,432,303 B2 * 4/2013   Mizuno ................... H03M 9/00
                                                    341/100

(Continued)

FOREIGN PATENT DOCUMENTS

KR       10-0891326 B1      3/2009
KR    10-2015-0025801 A     3/2015
KR    10-2016-0065632 A     6/2016

*Primary Examiner* — Ryan Jager
(74) *Attorney, Agent, or Firm* — IP & T Group LLP

(57) ABSTRACT

A clock generator circuit includes: first to $N^{th}$ nodes, where N is an even number equal to or greater than 2; and a parallel-to-serial conversion circuit suitable for parallel-to-serial converting signals of the first to $N^{th}$ nodes to output a clock through an output node, wherein, in an activation section of the clock, the signals of even-numbered nodes among the first to $N^{th}$ nodes have a first level, and the signals of odd-numbered nodes among the first to $N^{th}$ nodes have a second level which is different from the first level, and wherein, in a deactivation section of the clock, the signals of the first to $N^{th}$ nodes have the same level.

17 Claims, 11 Drawing Sheets

(51) Int. Cl.
  *H03L 7/091* (2006.01)
  *H03K 5/135* (2006.01)
  *H03K 5/00* (2006.01)

(52) U.S. Cl.
  CPC ............ *H03L 7/0814* (2013.01); *H03L 7/091* (2013.01); *H04L 7/0337* (2013.01); *H03K 2005/00052* (2013.01)

(58) Field of Classification Search
  USPC ........................................................ 327/105
  See application file for complete search history.

(56) References Cited

U.S. PATENT DOCUMENTS

| | | | | |
|---|---|---|---|---|
| 8,483,345 B2* | 7/2013 | Shinichi | ................. | H03L 7/087 |
| | | | | 375/376 |
| 8,665,928 B1* | 3/2014 | Klein | .................... | H04L 25/247 |
| | | | | 327/147 |
| 8,713,345 B2* | 4/2014 | Sugioka | ................ | H03L 7/0805 |
| | | | | 713/600 |
| 8,885,188 B2* | 11/2014 | Nakagawa | ................ | H02P 8/40 |
| | | | | 358/1.14 |
| 9,432,176 B2* | 8/2016 | Yu | ........................... | H04L 7/033 |
| 9,787,313 B1* | 10/2017 | Klein | ...................... | H03M 9/00 |
| 9,792,173 B2* | 10/2017 | Adachi | ............... | G06F 13/1689 |
| 9,800,234 B2* | 10/2017 | Tai | ......................... | H03K 5/135 |
| 10,742,201 B2* | 8/2020 | Venugopal | ............. | H03K 3/012 |
| 10,797,725 B2* | 10/2020 | Kim | ....................... | H03M 9/00 |
| 2014/0118040 A1* | 5/2014 | Nakayama | ............ | H03L 7/0816 |
| | | | | 327/157 |
| 2014/0198810 A1* | 7/2014 | Jones | ........................ | G06F 1/10 |
| | | | | 370/507 |
| 2019/0215146 A1* | 7/2019 | Ke | ............................ | H03M 9/00 |
| 2021/0234553 A1* | 7/2021 | Miura | .................... | H04L 7/0012 |
| 2021/0305989 A1* | 9/2021 | Han | ....................... | H03K 5/131 |
| 2022/0078003 A1* | 3/2022 | Park | ........................ | H04L 7/0037 |

\* cited by examiner

CLOCK GENERATOR CIRCUIT AND INTEGRATED CIRCUIT INCLUDING THE SAME

CROSS-REFERENCE TO RELATED APPLICATION

The present application is a continuation-in-part application of U.S. patent application Ser. No. 17/009,403 filed on Sep. 1, 2020 which claims priority under 35 U.S.C. § 119 to Korean Patent Application No. 10-2020-0043459 filed on Apr. 9, 2020. The disclosure of each of the foregoing applications is incorporated herein by reference in its entirety.

BACKGROUND

1. Field

Various embodiments of the present disclosure relate to a delay circuit, a phase interpolator, and a clock generator circuit.

2. Discussion of the Related Art

In general, phase interpolators are used to generate clocks having various phases in a variety of integrated circuits. A phase interpolator receives plural clocks having different phases and synthesizes the received clocks, thereby generating an output clock having a middle phase between phases of the received clocks.

FIG. 1 is a diagram illustrating a conventional phase interpolator 100 and an operation thereof.

Referring to FIG. 1, the phase interpolator 100 may include inverters 101 and 102 for transferring a first input clock CLKA_IN, inverters 106 and 107 for transferring a second input clock CLKB_IN, and inverters 103 to 105 for synthesizing the first input clock CLKA_IN and the second input clock CLKB_IN.

FIG. 1 shows that the first input clock CLKA_IN and the second input clock CLKB_IN have a phase difference 'dT' therebetween, and an interpolated output clock CLKAB_OUT outputted from the phase interpolator 100 has a middle phase between a first output clock CLKA_OUT and a second output clock CLKB_OUT. This is because the interpolated output clock CLKAB_OUT is generated by merging analog components of the periods in which the first input clock CLKA_IN and the second input clock CLKB_IN transition.

When the phase difference 'dT' between the first input clock CLKA_IN and the second input clock CLKB_IN is large, the period in which the first input clock CLKA_IN transitions and the period in which the second input clock CLKB_IN transitions do not overlap each other. In this case, it is impossible to synthesize analog components of the two clocks CLKA_IN and CLKB_IN. Therefore, when two clocks CLKA_IN and CLKB_IN to be synthesized are low-frequency clocks, it is impossible to perform phase interpolation using the conventional phase interpolator 100 of FIG. 1.

SUMMARY

Various embodiments of the present disclosure are directed to a phase interpolator capable of generating a middle phase clock between clocks having a phase difference therebetween.

In an embodiment of the present disclosure, a delay circuit may include: a first delay line suitable for delaying a first clock by a delay value that is adjusted based on a delay control code; a delay control circuit suitable for comparing a phase of the first clock delayed through the first delay line with a phase of a second clock to generate the delay control code; and a second delay line having, based on a delay control code, a delay value corresponding to a half of the delay value of the first delay line.

In an embodiment of the present disclosure, a phase interpolator may include: a first delay line suitable for delaying a first clock by a delay value that is adjusted based on a delay control code; a delay control circuit suitable for comparing a phase of the first clock delayed through the first delay line with a phase of a second clock to generate the delay control code; and a second delay line suitable for delaying, based on the delay control code, the first clock by a delay value corresponding to a half of the delay value of the first delay line, to generate a phase-interpolated clock.

In an embodiment of the present disclosure, a phase interpolator may include: a first delay line suitable for delaying a first input clock by a delay value that is adjusted based on a delay control code; a delay control circuit suitable for comparing a phase of the first input clock delayed through the first delay line with a phase of a second input clock to generate the delay control code; a first driver suitable for outputting the first input clock delayed by the first delay line as a first output clock; a first synthesizer suitable for synthesizing the first input clock delayed through the first delay line and the second input clock to drive a first node with a synthesized clock; a second delay line suitable for delaying, based on the delay control code, the synthesized clock of the first node by a delay value corresponding to a half of the delay value of the first delay line, to output the delayed clock as a second output clock; a second driver suitable for transferring the second input clock to a second node; and a third delay line suitable for delaying the clock of the second node by a delay value that is adjusted based on the delay control code and equal to the delay value of the first delay line, to output the delayed clock as a third output clock.

In an embodiment of the present disclosure, a phase interpolation method may include: delaying a first input clock by a delay value that is adjusted based on a delay control code; comparing a phase of the delayed first input clock with a phase of a second input clock to generate the delay control code configured to make the first and second input clocks in-phase; synthesizing the delayed first input clock and the second input clock to output a synthesized clock; delaying, based on the delay control code, the synthesized clock by a delay value corresponding to a half of the delay value of the first input clock, to output the delayed synthesized clock; delaying the second input clock by a delay value equal to the delay value of the first input clock, based on the delay control code.

The embodiments of the present disclosure may be able to generate a middle phase clock between clocks having a large phase difference therebetween.

In an embodiment of the present disclosure, a clock generator circuit includes: first to $N^{th}$ nodes, where N is an even number equal to or greater than 2; and a parallel-to-serial conversion circuit suitable for parallel-to-serial converting signals of the first to $N^{th}$ nodes to output a clock through an output node, wherein, in an activation section of the clock, the signals of even-numbered nodes among the first to $N^{th}$ nodes have a first level, and the signals of odd-numbered nodes among the first to $N^{th}$ nodes have a second level which is different from the first level, and wherein, in a deactivation section of the clock, the signals of the first to $N^{th}$ nodes have the same level.

In an embodiment of the present disclosure, an integrated circuit includes: a phase interpolator suitable for generating first to $N^{th}$ phase alignment clocks where N is an even number equal to or greater than 2, having different phases and first to $N^{th}$ phase strobing clocks having different phases between the phases of the first to $N^{th}$ phase alignment clocks; a signal alignment circuit suitable for aligning first to $N^{th}$ signals based on the first to $N^{th}$ phase alignment clocks; a first parallel-to-serial conversion circuit suitable for parallel-to-serial converting the first to $N^{th}$ signals which are aligned by the signal alignment circuit, based on the first to $N^{th}$ phase alignment clocks and outputting a serial signal; and a second parallel-to-serial conversion circuit suitable for parallel-to-serial converting signals of first to $N^{th}$ nodes based on the first to $N^{th}$ phase strobing clocks and outputting a strobing clock.

In an embodiment of the present disclosure, a method includes: generating an even number of alignment clocks and an even number of strobing clocks, the respective alignment clocks and the respective strobing clocks alternately having an equal phase difference; parallel-to-serial converting parallel signals based on the alignment clocks to output a serial signal; and parallel-to-serial converting an even number of node signals based on the strobing clocks to output a resultant clock, wherein a level of even ones of the node signals and a level of odd ones of the node signals are different from each other while the resultant clock is activated, and wherein the levels are a logic low level while the resultant clock is deactivated.

DETAILED DESCRIPTION

Figure 1:
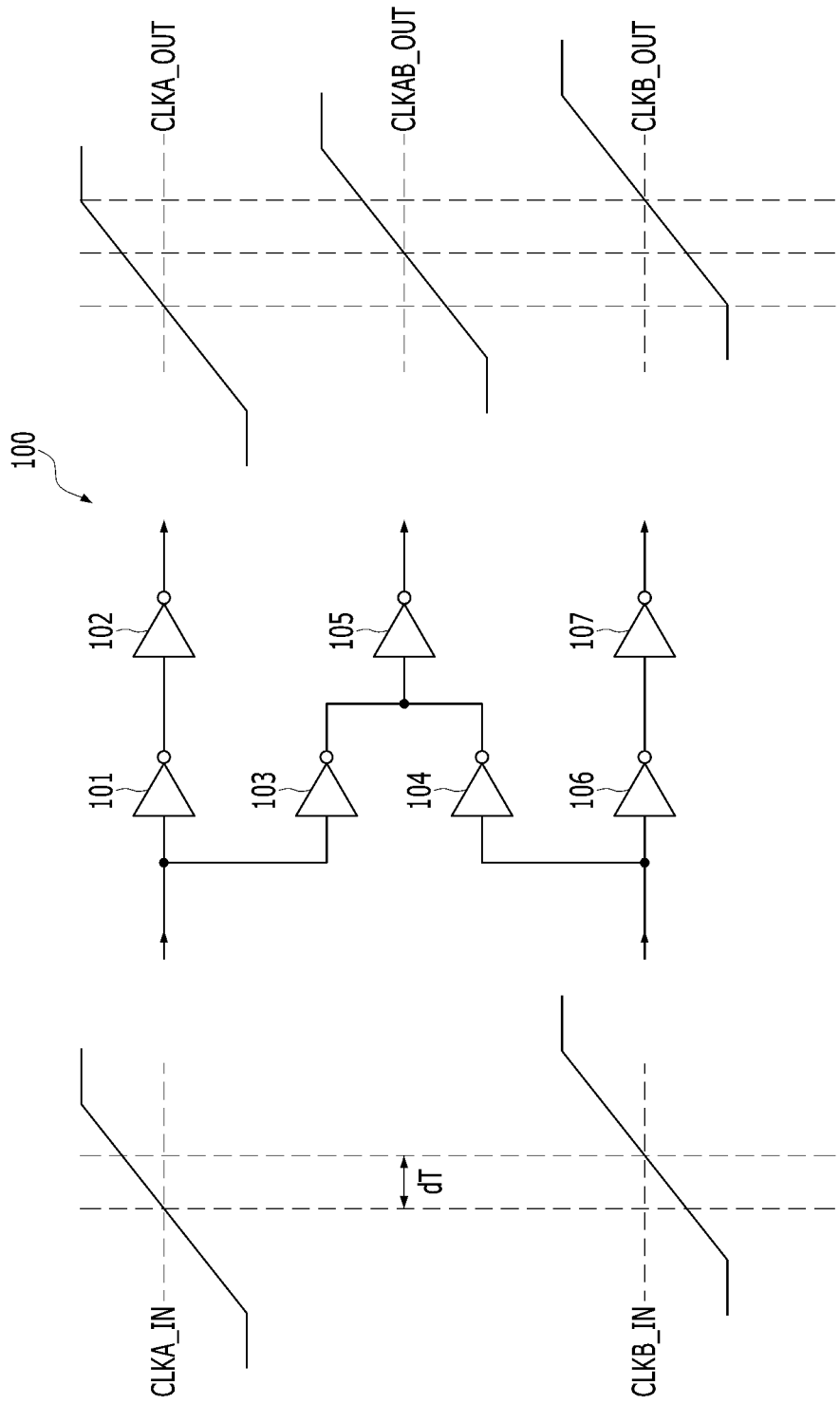
FIG. 1 is a diagram illustrating a conventional phase interpolator and an operation thereof.

Hereafter, various embodiments of the present disclosure will be described with reference to the accompanying drawings, in order to describe the present disclosure in detail such that a person skilled in the art to which the present disclosure pertains can easily carry out the technical spirit of the present disclosure. In the descriptions of the embodiments, components which are irrelevant to the subject matter of the embodiments may be omitted. When reference numbers are given to components of the drawings, the same components will be represented by like reference numerals even though the components are illustrated in different drawings.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present disclosure.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or it is clear from context to be directed to a singular form.

Figure 2:
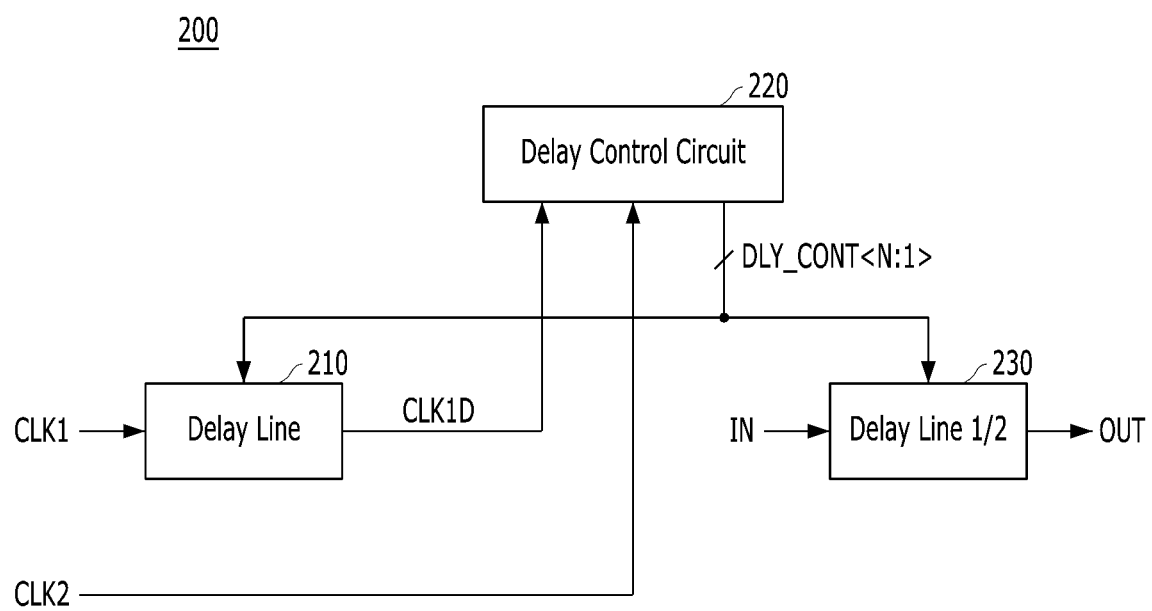
FIG. 2 is a diagram illustrating a delay circuit 200 in accordance with an embodiment of the present disclosure.

FIG. 2 is a diagram illustrating a delay circuit 200 in accordance with an embodiment of the present disclosure.

Referring to FIG. 2, the delay circuit 200 may include a first delay line 210, a delay control circuit 220 and a second delay line 230.

The first delay line 210 may generate a delayed first clock CLK1D by delaying a first clock CLK1. The first delay line 210 may have a delay value which is adjusted by a delay control code DLY_CONT<N:1>.

The delay control circuit 220 may generate the delay control code DLY_CONT<N:1> by comparing the phases of the delayed first clock CLK1D and the second clock CLK2. The delay control circuit 220 may increase or decrease the code value of the delay control code DLY_CONT<N:1> according to the result of the phase comparison between the delayed first clock CLK1D and a second clock CLK2. Therefore, the delay control circuit 220 may generate the delay control code DLY_CONT<N:1> such that the delayed first clock CLK1D and the second clock CLK2 are in phase, that is, the delay value of the first delay line 210 becomes equal to a phase difference between the first and second clocks CLK1 and CLK2.

The second delay line 230 may have a delay value which is adjusted by the delay control code DLY_CONT<N:1>, and corresponds to a half of the delay value of the first delay line 210. Since the second delay line 230 receives the same delay control code DLY_CONT<N:1> as the first delay line 210, the second delay line 230 may be designed to have a delay value corresponding to half of the delay value of the first delay line 210. The second delay line 230 may be used to delay a random signal IN which needs to be delayed.

Referring to FIG. 2, the first delay line 210 may have a delay value corresponding to a phase difference between the first and second clocks CLK1 and CLK2, and the second delay line 230 may have a delay value corresponding to a half of the phase difference between the first and second clocks CLK1 and CLK2. Based on such characteristics, a phase interpolator may be designed which will be described below.

Figure 3:
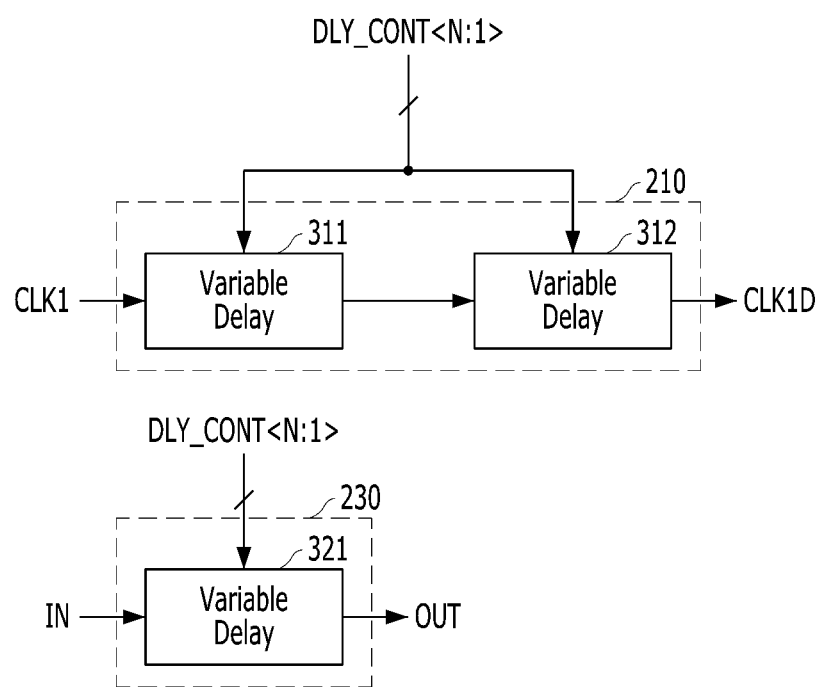
FIG. 3 is a detailed diagram illustrating a first embodiment of first and second delay lines of FIG. 2.

FIG. 3 is a detailed diagram illustrating a first embodiment of the first and second delay lines 210 and 230 of FIG. 2.

Referring to FIG. 3, the first delay line 210 may include two variable delays 311 and 312, and the second delay line 230 may include one variable delay 321.

The first delay line 210 may include a first variable delay 311 and a second variable delay 312 which are coupled in series. Each of the first and second variable delays 311 and 312 may have a delay value which is adjusted by the delay control code DLY_CONT<N:1>, and the first and second variable delays 311 and 312 may be designed in the same manner (i.e., may have the same configuration of elements) and have the same delay value.

The second delay line 230 may include a third variable delay 321. The third variable delay 321 may have a delay value which is adjusted by the delay control code DLY_CONT<N:1>. The third variable delay 321 may be designed in the same manner (i.e., may have the same configuration of elements) as the first variable delay 311 and have the same delay value as the first variable delay 311.

Since the first to third variable delays 311, 312 and 321 are designed in the same manner and receive the same delay control code DLY_CONT<N:1>, the delay values of the first to third variable delays 311, 312 and 321 may be equal to one another. Since the first delay line 210 includes two variable delays 311 and 312 coupled in series and the second delay line 230 includes one variable delay 321, the delay value of the first delay line 210 may be twice as large as that of the second delay line 230.

Figure 4:
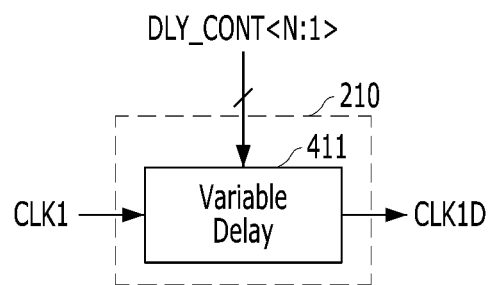
FIG. 4 is a detailed diagram illustrating a second embodiment of the first and second delay lines of FIG. 2.
Figure 4:
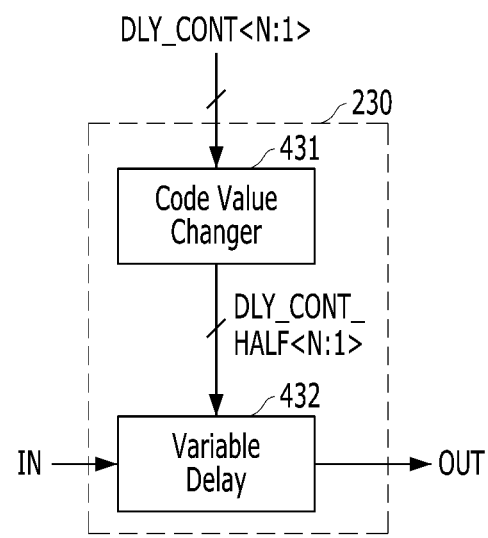

FIG. 4 is a detailed diagram illustrating a second embodiment of the first and second delay lines 210 and 230 of FIG. 2.

Referring to FIG. 4, the first delay line 210 may include a first variable delay 411. The first variable delay 411 may have a delay value which is adjusted by the delay control code DLY_CONT<N:1>.

The second delay line 230 may include a code value changer 431 and a second variable delay 432.

The code value changer 431 may generate a half delay control code DLY_CONT_HALF<N:1> by halving the code value of the delay control code DLY_CONT<N:1>. The half delay control code DLY_CONT_HALF<N:1> may be a code for controlling a delay value to ½ of the code value of the delay control code DLY_CONT<N:1>. The delay control code DLY_CONT<N:1> may have a binary code format or a thermometer code format. In any case, the code value changer 431 may generate the half delay control code DLY_CONT_HALF<N:1> such that the delay value corresponding to the half delay control code DLY_CONT_HALF<N:1> becomes half of the delay value corresponding to the delay control code DLY_CONT<N:1>.

The second variable delay 432 may be designed in the same manner (i.e., may have the same configuration of elements) as the first variable delay 411, and have a delay value which is adjusted by the half delay control code DLY_CONT_HALF<N:1>. Therefore, the second variable delay 432 may have a delay value corresponding to half of the delay value of the first variable delay 411.

Figure 5:
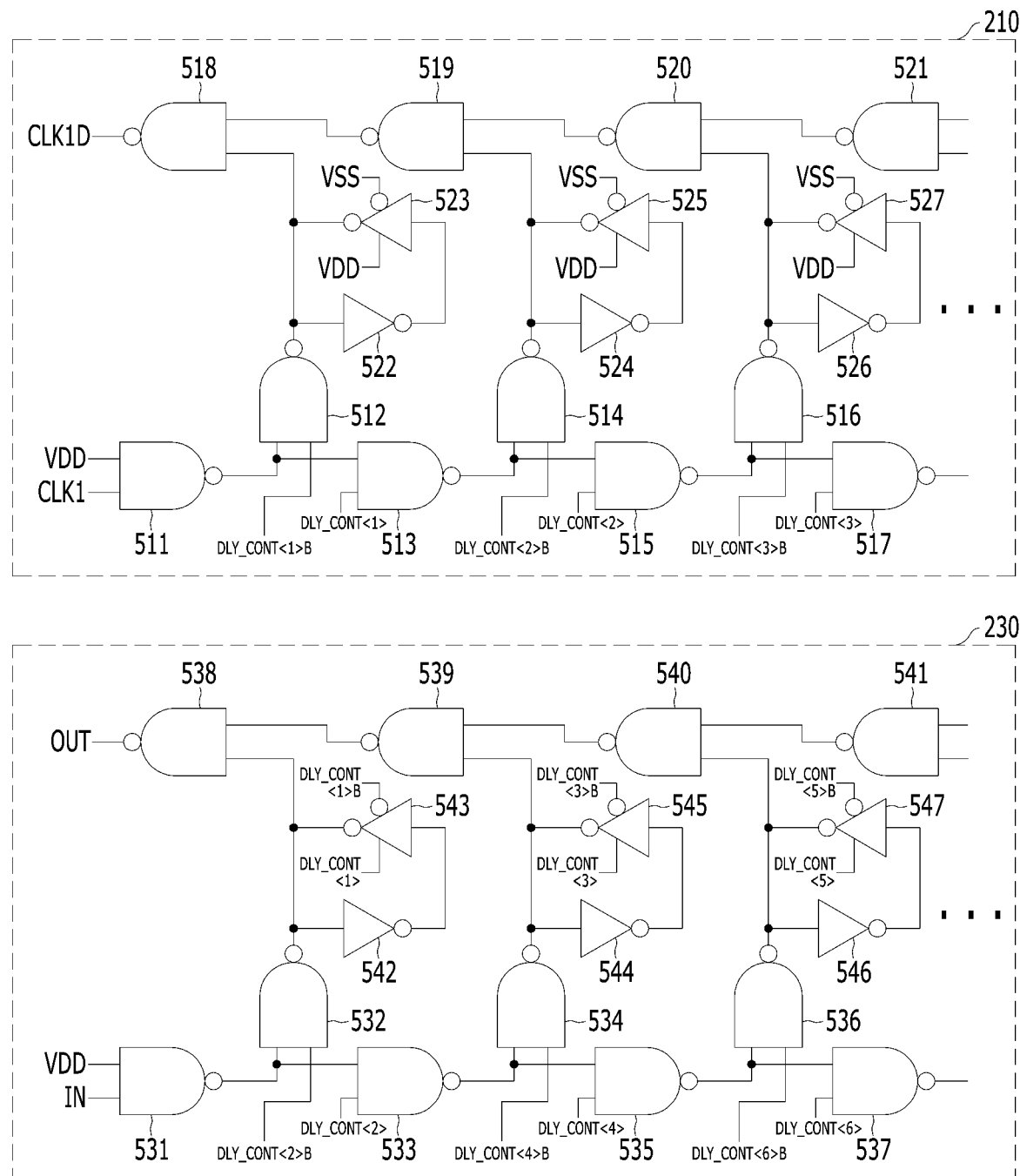
FIG. 5 is a detailed diagram illustrating a third embodiment of the first and second delay lines of FIG. 2.

FIG. 5 is a detailed diagram illustrating a third embodiment of the first and second delay lines 210 and 230 of FIG. 2. In FIG. 5, <1> to <N> may represent N bits of the delay control code DLY_CONT<N:1>. Furthermore, <1>B to <N>B may represent bits obtained by inverting N bits of the delay control code DLY_CONT<N:1>.

Referring to FIG. 5, the first delay line 210 may include NAND gates 511 to 521 and inverters 522 to 527. The first delay line 210 may have a delay value which is adjusted by the delay control code DLY_CONT<N:1>. When the delay control code has a value of 000 . . . 11, the first clock CLK1 may be delayed through the NAND gates 511, 513, 515, 516, 520, 519 and 518. Furthermore, when the delay control code DLY_CONT<N:1> has a value of 000 . . . 01, the first clock CLK1 may be delayed through the NAND gates 511, 513, 514, 519 and 518. The inverters 522 to 527 may serve as a latch which are used to form loading. According to the value of the delay control code DLY_CONT<N:1>, the path through which the first clock CLK1 passes in the first delay line 210 may be adjusted in the first delay line 210. That is, according to the value of the delay control code DLY_CONT<N:1>, one of the N paths may be selected, and the first clock CLK1 may be delayed by the selected path. For reference, NAND gates 512, 514, and 516 may select the path through which the first clock CLK1 passes in the first delay line 210.

The second delay line 230 may include NAND gates 531 to 541 and inverters 542 to 547. The second delay line 230 may have N/2 paths, and one of the N/2 paths may be selected by even code values DLY_CONT<2>, <4>, . . . , and <N> of the delay control code DLY_CONT<N:1>, and used to delay an input signal IN. Odd code values DLY_CONT<1>, <3>, . . . , and <N−1> of the delay control code DLY_CONT<N:1> may enable or disable a latch composed of the inverters 542 to 547, thereby adjusting loading. When the delay control code DLY_CONT<N:1> has a value of 000 . . . 11, the input signal IN may be delayed through the NAND gates 531, 533, 534, 539 and 538. In this case, the inverter 543 may be disabled. Thus, a latch formed by the inverters 544 and 545 may be disabled. When the delay control code DLY_CONT<N:1> has a value of 000 . . . 01, the input signal IN may be delayed through the NAND gates 531, 532 and 538. In this case, the inverter 543 may be enabled. Thus, a latch formed by the inverters 542 and 543 may be enabled to increase loading. For reference, NAND gates 542, 544, and 546 may select the path through which the input signal IN passes in the second delay line 230.

Since the delay values of the first and second delay lines 210 and 230 are adjusted by the same delay control code DLY_CONT<N:1>, and a path having a length corresponding to a half of the length of the first delay line 210 is selected in the second delay line 230, the second delay line 230 may have a delay value corresponding to half of the delay value of the first delay line 210.

Figure 6:
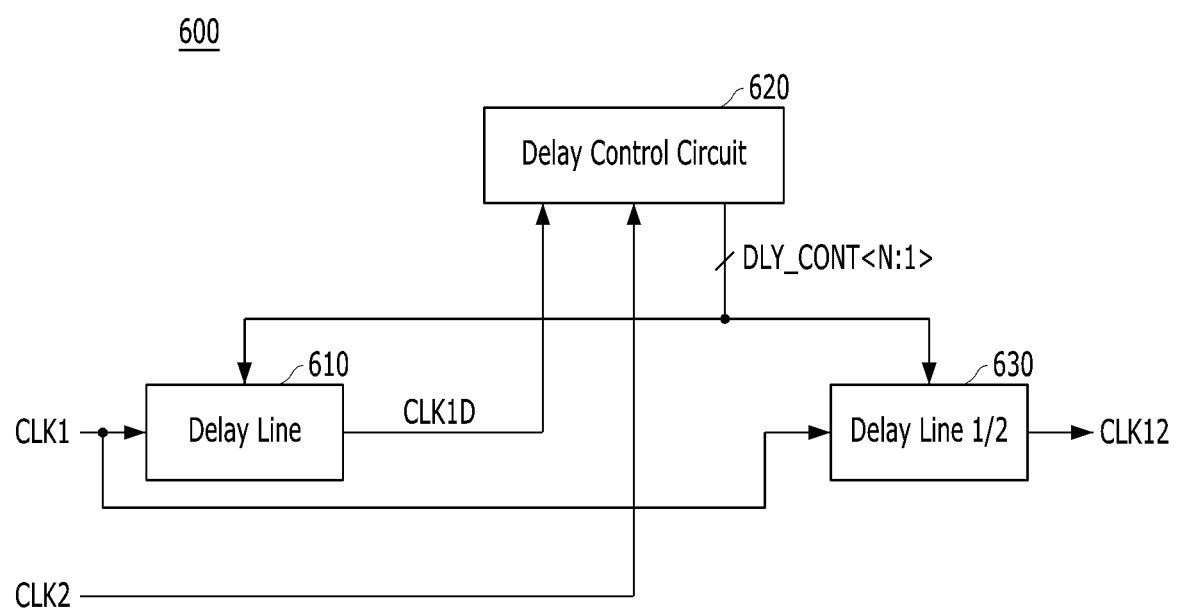
FIG. 6 is a diagram illustrating a phase interpolator in accordance with an embodiment of the present disclosure.

FIG. 6 is a diagram illustrating a phase interpolator 600 in accordance with an embodiment of the present disclosure.

Referring to FIG. 6, the phase interpolator 600 may include a first delay line 610, a delay control circuit 620 and a second delay line 630.

The first delay line 610 may generate a delayed first clock CLK1D by delaying a first clock CLK1. The first delay line 610 may have a delay value which is adjusted by a delay control code DLY_CONT<N:1>. The first delay line 610 may be designed in the same manner (i.e., may have the same configuration of elements) as the first delay line 210.

The delay control circuit 620 may generate the delay control code DLY_CONT<N:1> by comparing the phases of the delayed first clock CLK1D and a second clock CLK2. The delay control circuit 620 may increase or decrease the code value of the delay control code DLY_CONT<N:1> according to the result of the phase comparison between the delayed first clock CLK1D and the second clock CLK2. Therefore, the delay control circuit 620 may generate the delay control code DLY_CONT<N:1> such that the delayed first clock CLK1D and the second clock CLK2 are in phase, that is, the delay value of the first delay line 610 becomes equal to a phase difference between the first and second clocks CLK1 and CLK2.

The second delay line 630 may have a delay value which is adjusted by the delay control code DLY_CONT<N:1>, and corresponds to a half of the delay value of the first delay line 610. Since the second delay line 630 receives the same delay control code DLY_CONT<N:1> as the first delay line 610, the second delay line 630 may be designed to have a delay value corresponding to half of the delay value of the first delay line 610. The second delay line 630 may be designed in the same manner (i.e., may have the same configuration of elements) as the second delay line 230.

The second delay line 630 may generate a phase-interpolated clock CLK12 by delaying the first clock CLK1. Since the second delay line 630 has a delay value corresponding to a half of a phase difference between the first and second clocks CLK1 and CLK2 and the phase-interpolated clock CLK12 is obtained by delaying the first clock CLK1 through the second delay line 630, the phase-interpolated clock CLK12 may have a middle phase between the first and second clocks CLK1 and CLK2.

Figure 7:
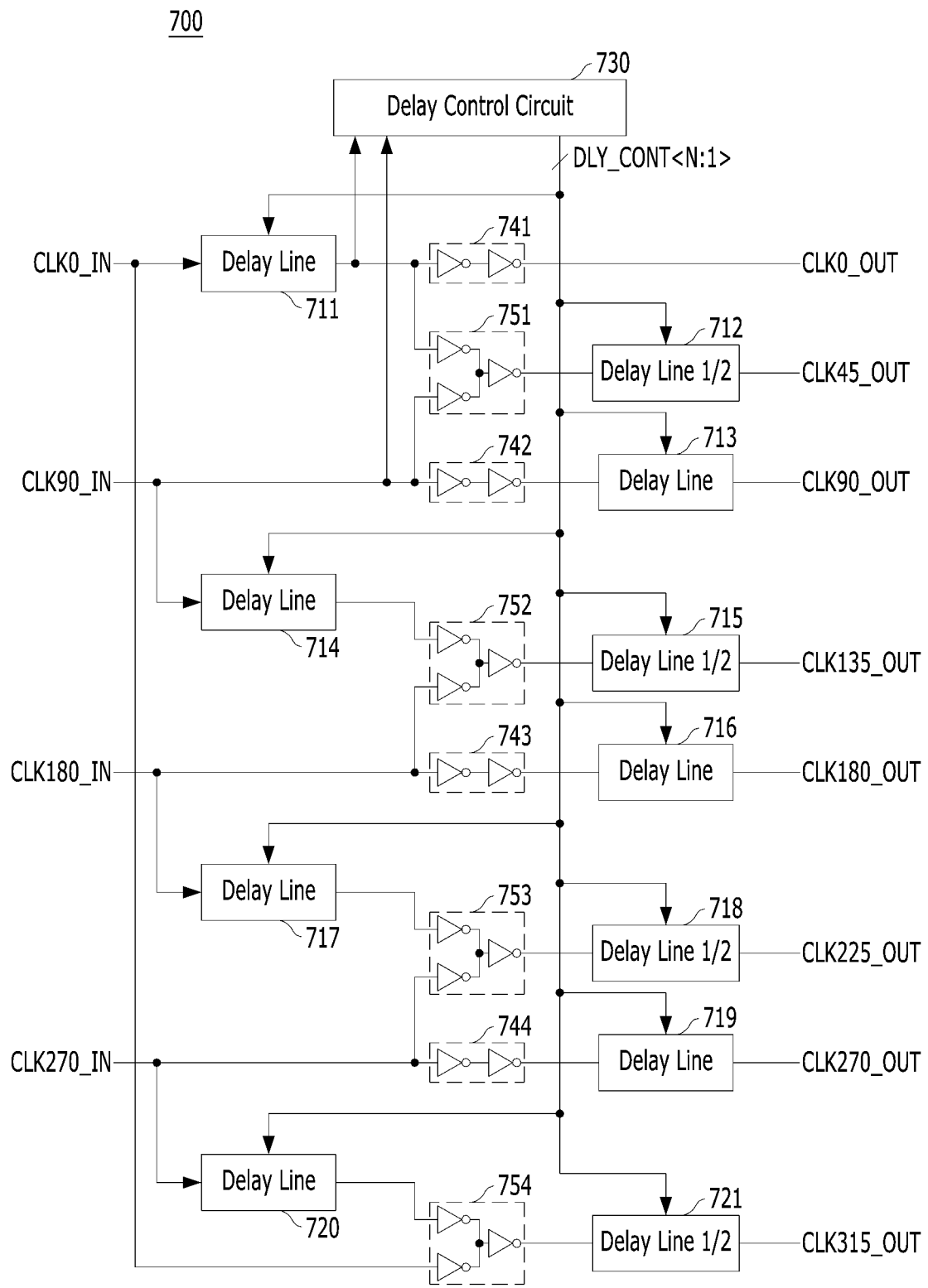
FIG. 7 is a diagram illustrating a phase interpolator in accordance with another embodiment of the present disclosure.

FIG. 7 is a diagram illustrating a phase interpolator 700 in accordance with another embodiment of the present disclosure. The phase interpolator 700 of FIG. 7 may generate eight output clocks CLK0_OUT, CLK45_OUT, CLK90_OUT, CLK135_OUT, CLK180_OUT, CLK225_OUT, CLK270_OUT and CLK315_OUT which have a phase difference of 45 degrees therebetween, using four input clocks CLK0_IN, CLK90_IN, CLK180_IN and CLK270_IN which have a phase difference of 90 degrees therebetween.

Referring to FIG. 7, the phase interpolator 700 may include first to eleventh delay lines 711 to 721, a delay control circuit 730, first to fourth drivers 741 to 744 and first to fourth synthesizers 751 to 754.

The first delay line 711 may have a delay value which is adjusted by a delay control code DLY_CONT<N:1>, and delay a first input clock CLK0_IN.

The delay control circuit 730 may generate the delay control code DLY_CONT<N:1> by comparing the phases of an output clock of the first delay line 711 and a second input clock CLK90_IN. As a result, the delay control circuit 730 may generate the delay control code DLY_CONT<N:1> such that the output clock of the first delay line 711 and the second input clock CLK90_IN are in phase, that is, the delay value of the first delay line 711 becomes equal to a phase difference between the first input clock CLK0_IN and the second input clock CLK90_IN.

The first driver 741 may output the output clock of the first delay line 711 as a first output clock CLK0_OUT. The first driver 741 may include two inverters coupled in series.

The first synthesizer 751 may synthesize the output clock of the first delay line 711 and the second input clock CLK90_IN, and transfer the synthesized clock to the second delay line 712. Since the output clock of the first delay line 711 and the second input clock CLK90_IN are in phase, it may be considered that the first synthesizer 751 transfers the two clocks to the second delay line 712. The first synthesizer 751 may include three inverters.

The second delay line 712 may have a delay value which is adjusted by the delay control code DLY_CONT<N:1>, and corresponds to a half of the delay value of the first delay line 711. That is, the second delay line 712 may have a delay value corresponding to a phase difference of 45 degrees between the clocks. The second delay line 712 may delay the output clock of the first synthesizer 751, and output the delayed clock as a second output clock CLK45_OUT.

The second driver 742 may transfer the second input clock CLK90_IN to the third delay line 713. The second driver 742 may include two inverters coupled in series.

The third delay line 713 may have a delay value which is adjusted by the delay control code DLY_CONT<N:1>, and equal to the delay value of the first delay line 711. That is, the third delay line 713 may have a delay value corresponding to a phase difference of 90 degrees between clocks. The third delay line 713 may delay the output clock of the second driver, and output the delayed clock as a third output clock CLK90_OUT.

The fourth delay line 714 may have a delay value which is adjusted by the delay control code DLY_CONT<N:1>, and equal to the delay value of the first delay line 711. The fourth delay line 714 may delay the second input clock CLK90_IN.

The second synthesizer 752 may transfer the output clock of the fourth delay line 714 and a third input clock CLK180_IN to the fifth delay line 715. The second synthesizer 752 may include three inverters.

The fifth delay line 715 may have a delay value which is adjusted by the delay control code DLY_CONT<N:1>, and corresponds to a half of the delay value of the first delay line 711. The fifth delay line 715 may delay the output clock of the second synthesizer 752, and output the delayed clock as a fourth output clock CLK135_OUT.

The third driver 743 may transfer the third input clock CLK180_IN to the sixth delay line 716. The third driver 743 may include two inverters coupled in series.

The sixth delay line 716 may have a delay value which is adjusted by the delay control code DLY_CONT<N:1>, and equal to the delay value of the first delay line 711. The sixth delay line 716 may delay the output clock of the third driver 743, and output the delayed clock as a fifth output clock CLK180_OUT.

The seventh delay line 717 may have a delay value which is adjusted by the delay control code DLY_CONT<N:1>, and equal to the delay value of the first delay line 711. The seventh delay line 717 may delay the third input clock CLK180_IN.

The third synthesizer 753 may transfer the output clock of the seventh delay line 717 and a fourth input clock CLK270_IN to the eighth delay line 718. The third synthesizer 753 may include three inverters.

The eighth delay line 718 may have a delay value which is adjusted by the delay control code DLY_CONT<N:1>, and corresponds to a half of the delay value of the first delay line 711. The eighth delay line 718 may delay the output clock of the third synthesizer 753, and output the delayed clock as a sixth output clock CLK225_OUT.

The fourth driver 744 may transfer the fourth input clock CLK270_IN to the ninth delay line 719. The fourth driver 744 may include two inverters coupled in series.

The ninth delay line 719 may have a delay value which is adjusted by the delay control code DLY_CONT<N:1>, and equal to the delay value of the first delay line 711. The ninth delay line 719 may delay the output clock of the fourth driver 744, and output the delayed clock as a seventh output clock CLK270_OUT.

The tenth delay line 720 may have a delay value which is adjusted by the delay control code DLY_CONT<N:1>, and equal to the delay value of the first delay line 711. The tenth delay line 720 may delay the fourth input clock CLK270_IN.

The fourth synthesizer 754 may transfer the output clock of the tenth delay line 720 and the first input clock CLK0_IN to the eleventh delay line 721.

The eleventh delay line 721 may have a delay value which is adjusted by the delay control code DLY_CONT<N:1>, and corresponds to a half of the delay value of the first delay line 711. The eleventh delay line 721 may delay the output clock of the fourth synthesizer 754, and output the delayed clock as an eighth output clock CLK315_OUT.

In accordance with the embodiment of FIG. 7, the delay lines 711, 713, 714, 716, 717, 719 and 720 having a delay value corresponding to a phase difference of 90 degrees between clocks and the delay lines 712, 715, 718 and 721 having a delay value corresponding to a phase difference of 45 degrees between clocks may be combined so that the phase interpolator may be able to generate the clocks CLK0_OUT, CLK45_OUT, CLK90_OUT, CLK135_OUT, CLK180_OUT, CLK225_OUT, CLK270_OUT and CLK315_OUT having a desired phase.

Figure 8:
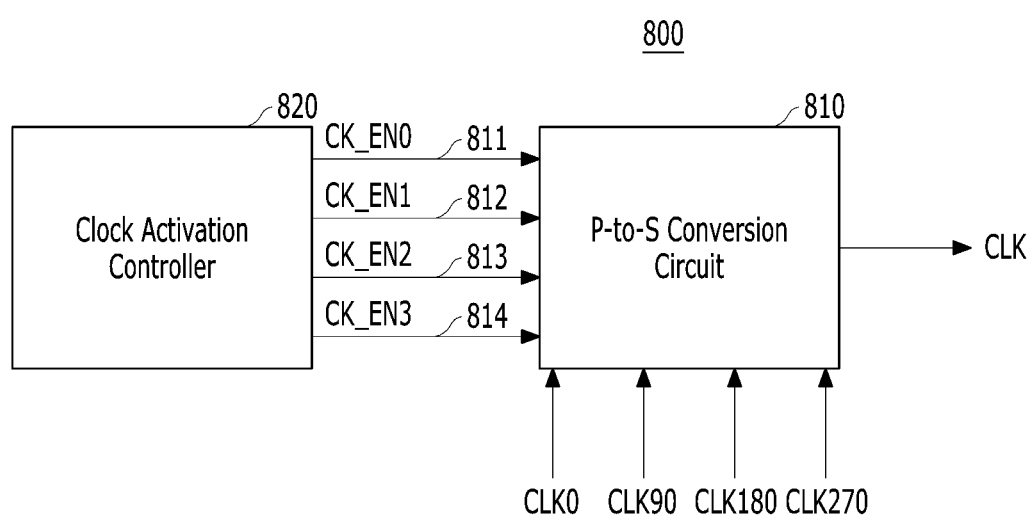
FIG. 8 is a block diagram illustrating a clock generator circuit 800 in accordance with an embodiment of the present disclosure.

FIG. 8 is a block diagram illustrating a clock generator circuit 800 in accordance with an embodiment of the present disclosure.

Referring to FIG. 8, the clock generator circuit 800 may include a parallel-to-serial conversion circuit 810 and a clock activation controller 820.

The parallel-to-serial conversion circuit 810 may perform parallel-to-serial conversion on the signals CK_EN0 to CK_EN3 of first to $N^{th}$ nodes 811 to 814. The parallel-to-serial conversion circuit 810 may perform a parallel-to-serial conversion operation based on first to $N^{th}$ phase clocks CLK0, CLK90, CLK180, and CLK270 having different phases. The parallel-to-serial conversion circuit 810 may perform parallel-to-serial conversion on the signals CK_EN0 to CK_EN3 of the first to $N^{th}$ nodes 811 to 814 to generate a clock CLK. Herein, N may be an even number equal to or greater than 2, and it is exemplified herein that N is 4.

The clock activation controller 820 may generate the signals CK_EN0 to CK_EN3 to be transferred to the first to fourth nodes 811 to 814 of the parallel-to-serial conversion circuit 810. The clock activation controller 820 may control activation and deactivation of the clock CLK. The clock activation controller 820 may activate the clock CLK by differently controlling the voltage levels of the signals CK_EN0 and CK_EN2 of the odd-numbered nodes 811 and 813 and the signals CK_EN1 and CK_EN3 of the even-numbered nodes 812 and 814. Also, the clock activation controller 820 may deactivate the clock CLK by controlling all the voltage levels of the signals CK_EN0 to CK_EN3 to be the same.

Figure 9:
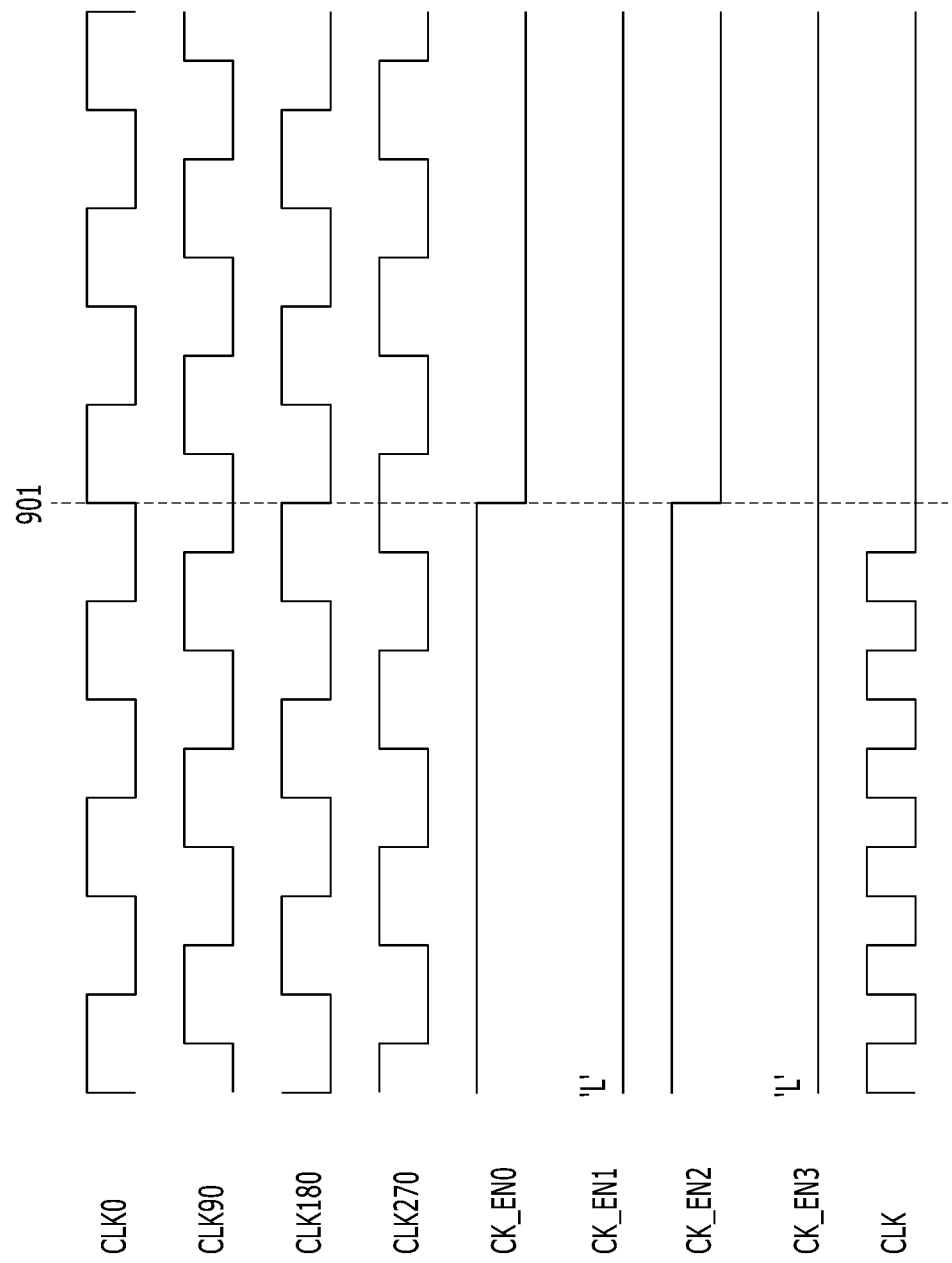
FIG. 9 is a timing diagram illustrating an operation of the clock generator circuit 800 of FIG. 8 in accordance with an embodiment of the present disclosure.

FIG. 9 is a timing diagram illustrating an operation of the clock generator circuit 800 of FIG. 8 in accordance with an embodiment of the present disclosure.

Referring to FIG. 9, adjacent two phase clocks among the first to fourth phase clocks CLK0, CLK90, CLK180, and CLK270 may have a phase difference of 90 degrees each other.

The parallel-to-serial conversion circuit 810 may output, as the clock CLK, the signal CK_EN0 of the first node 811 while the first phase clock CLK0 has a logic high level and the second phase clock CLK90 has a logic low level and may output, as the clock CLK, the signal CK_EN1 of the second node 812 while the second phase clock CLK90 has a logic high level and the third phase clock CLK180 has a logic low level. Also, the parallel-to-serial conversion circuit 810 may output, as the clock CLK, the signal CK_EN2 of the third node 813 while the third phase clock CLK180 has a logic high level and the fourth phase clock CLK270 has a logic low level and may output, as the clock CLK, the signal CK_EN3 of the fourth node 814 while the fourth phase clock CLK270 has a logic high level and the first phase clock CLK0 has a logic low level.

Before a moment 901, the signals CK_EN0 and CK_EN2 of the odd-numbered nodes 811 and 813 have a logic high level and the signals CK_EN1 and CK_EN3 of the even-numbered nodes 812 and 814 have a logic low level. Thus, when the signals CK_EN0 to CK_EN3 are parallel-to-serial converted based on the first to fourth phase clocks CLK0, CLK90, CLK180 and CLK270, the clock CLK that toggles may be generated. In other words, the clock CLK may be activated.

Since the signals CK_EN0 to CK_EN3 are all at the same level after the moment 901, the clock CLK may be fixed without being toggled even though the signals CK_EN0 to CK_EN3 are parallel-to-serial converted. In other words, the clock CLK may be deactivated.

Referring to FIGS. 8 to 9, it is possible to generate a clock CLK having twice the frequency of the first to fourth phase clocks CLK0, CLK90, CLK180, and CLK270 and synchronized with the first to fourth phase clocks CLK0, CLK90, CLK180, and CLK270 by parallel-to-serial converting the signals CK_EN0 to CK_EN3 based on the first to fourth phase clocks CLK0, CLK90, CLK180, and CLK270. Herein, "synchronized" may mean that the transition time of the clock CLK coincides with the transition time of the first to fourth phase clocks CLK0, CLK90, CLK180, and CLK270. Also, it is possible to deactivate the clock CLK by controlling the signals CK_EN0 to CK_EN3 to have the same level.

Figure 10:
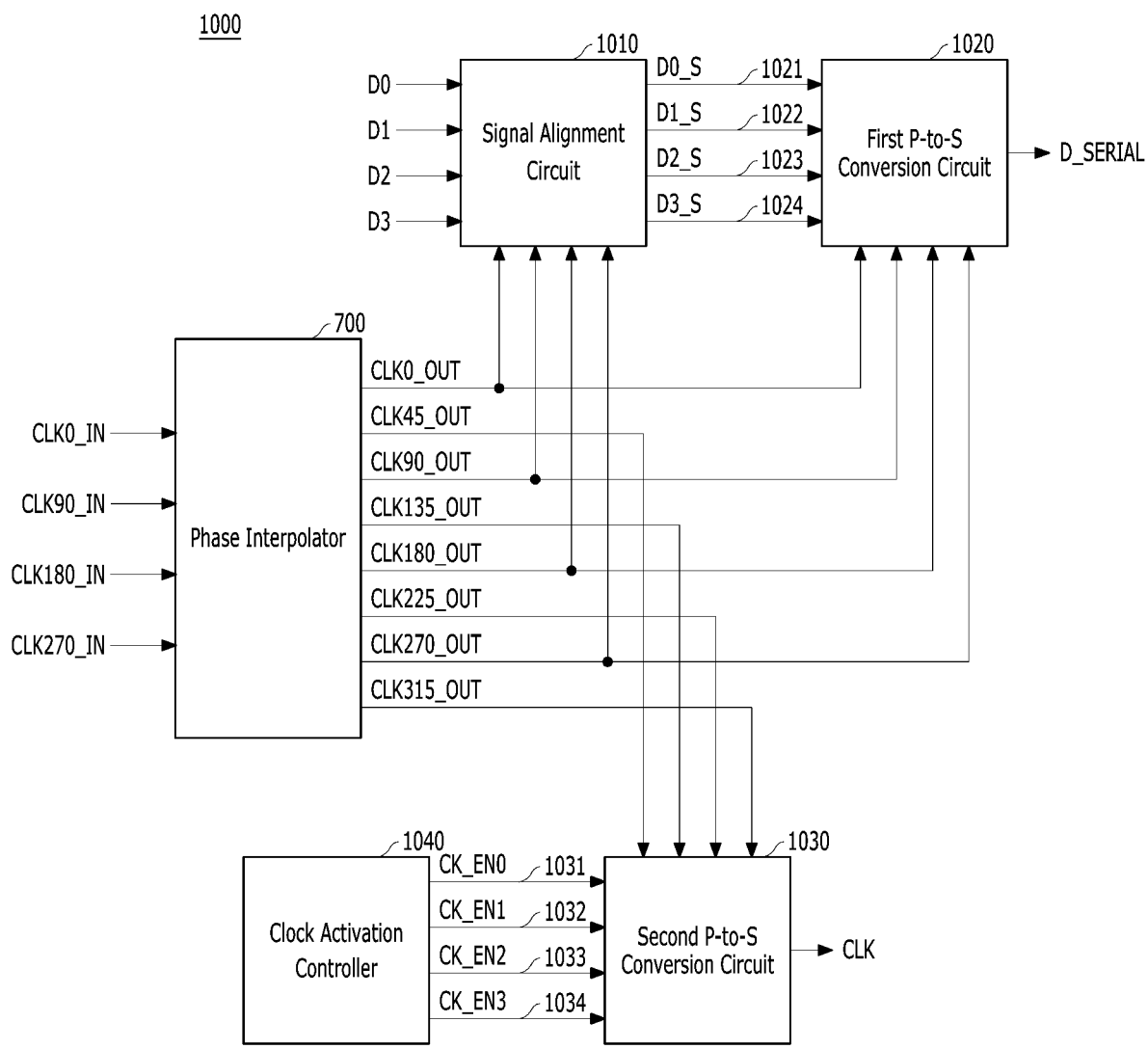
FIG. 10 is a block diagram illustrating an integrated circuit 1000 in accordance with an embodiment of the present disclosure.

FIG. 10 is a block diagram illustrating an integrated circuit 1000 in accordance with an embodiment of the present disclosure.

Referring to FIG. 10, the integrated circuit 1000 may include a phase interpolator 700, a signal alignment circuit 1010, a first parallel-to-serial conversion circuit 1020, a second parallel-to-serial conversion circuit 1030, and a clock activation controller 1040.

The phase interpolator 700 may generate eight output clocks CLK0_OUT, CLK45_OUT, CLK90_OUT, CLK135_OUT, CLK180_OUT, CLK225_OUT, CLK270_OUT, and CLK315_OUT whose phases are different by 45 degrees based on the four input clocks CLK0_IN, CLK90_IN, CLK180_IN, and CLK270_IN whose phases are different by 90 degrees. The phase interpolator 700 may be implemented as shown in FIG. 7. Hereinafter, among the output clocks CLK0_OUT, CLK45_OUT, CLK90_OUT, CLK135_OUT, CLK180_OUT, CLK225_OUT, CLK270_OUT, and CLK315_OUT of the phase interpolator 700, the clocks CLK0_OUT, CLK90_OUT, CLK180_OUT, and CLK270_OUT may be referred to as first to fourth phase alignment clocks, and the clocks CLK45_OUT, CLK135_OUT, CLK225_OUT and CLK315_OUT may be referred to as first to fourth phase strobing clocks.

The signal alignment circuit 1010 may align the parallel signals D0 to D3 based on the first to fourth phase alignment clocks CLK0_OUT, CLK90_OUT, CLK180_OUT, and CLK270_OUT. The parallel signal D0 may be aligned with the first phase alignment clock CLK0_OUT, and the parallel signal D1 may be aligned with the second phase alignment clock CLK90_OUT. The parallel signal D2 may be aligned with the third phase alignment clock CLK180_OUT, and the parallel signal D3 may be aligned with the fourth phase alignment clock CLK270_OUT. The parallel signals D0_S to D3_S that are output from the signal alignment circuit 1010 may represent the parallel signals D0 to D3 aligned based on the first to fourth phase alignment clocks CLK0_OUT, CLK90_OUT, CLK180_OUT, and CLK270_OUT. In the integrated circuit 1000, the parallel signals D0_S to D3_S aligned based on the first to fourth phase alignment clocks CLK0_OUT, CLK90_OUT, CLK180_OUT, and CLK270_OUT may be transferred to various destinations in the integrated circuit 1000.

The first parallel-to-serial conversion circuit 1020 may parallel-to-serial convert the parallel signals D0_S to D3_S based on the first to fourth phase alignment clocks CLK0_OUT, CLK90_OUT, CLK180_OUT, and CLK270_OUT. The first parallel-to-serial conversion circuit 1020 may output the parallel signal D0_S of the first node 1021 as a serial signal D_SERIAL while the first phase alignment clock CLK0_OUT has a logic high level and the second phase alignment clock CLK90_OUT has a logic low level, output the parallel signal D1_S of the second node 1022 as the serial signal D_SERIAL while the second phase alignment clock CLK90_OUT has a logic high level and the third phase alignment clock CLK180_OUT has a logic low level, output the parallel signal D2_S of the third node 1023 as the serial signal D_SERIAL while the third phase alignment clock CLK180_OUT has a logic high level and the fourth phase alignment clock CLK270_OUT has a logic low level, and output the parallel signal D3_S of the fourth node 1024 is) as a serial signal D_SERIAL while the fourth phase alignment clock CLK270_OUT has a logic high level and the first phase alignment clock CLK0_OUT has a logic low level.

The second parallel-to-serial conversion circuit 1030 and the clock activation controller 1040 may be used to generate a clock CLK and to activate and deactivate the clock CLK like the clock generator circuit 800 of FIG. 8.

The clock activation controller 1040 may generate signals CK_EN0 to CK_EN3 to be transferred to the nodes 1031 to 1034 of the second parallel-to-serial conversion circuit 1030. The clock activation controller 1040 may control activation and deactivation of the clock CLK. The clock activation controller 1040 may activate the clock CLK by differently controlling the voltage levels of the signals CK_EN0 and CK_EN2 of the odd-numbered nodes 1031 and 1033 and the signals CK_EN1 and CK_EN3 of the even-numbered nodes 1032 and 1034. Also, the clock activation controller 1040 may deactivate the clock CLK by controlling all voltage levels of the signals CK_EN0 to CK_EN3 to be the same.

The second parallel-to-serial conversion circuit 1030 may generate a clock CLK by parallel-to-serial converting the signals CK_EN0 to CK_EN3 transferred to the nodes 1031 to 1034 based on the first to fourth phase strobing clocks CLK45_OUT, CLK135_OUT, CLK225_OUT, and CLK315_OUT. The second parallel-to-serial conversion circuit 1030 may output the signal CK_EN0 of the node 1031 as the clock CLK while the first phase strobing clock CLK45_OUT has a logic high level and the second phase alignment clock CLK135_OUT has a logic low level. It may output the signal CK_EN1 of the node 1032 as the clock CLK while the second phase strobing clock CLK135_OUT has a logic high level and the third phase alignment clock CLK225_OUT has a logic low level. It may output the signal CK_EN2 of the node 1033 as the clock CLK while the third phase strobing clock CLK225_OUT has logic high level and the fourth phase alignment clock CLK315_OUT has logic low level. It may output the signal CK_EN3 of the node 1034 as the clock CLK while the fourth phase strobing clock CLK315_OUT has a logic high level and the first phase alignment clock CLK45_OUT has a logic low level.

Figure 11:
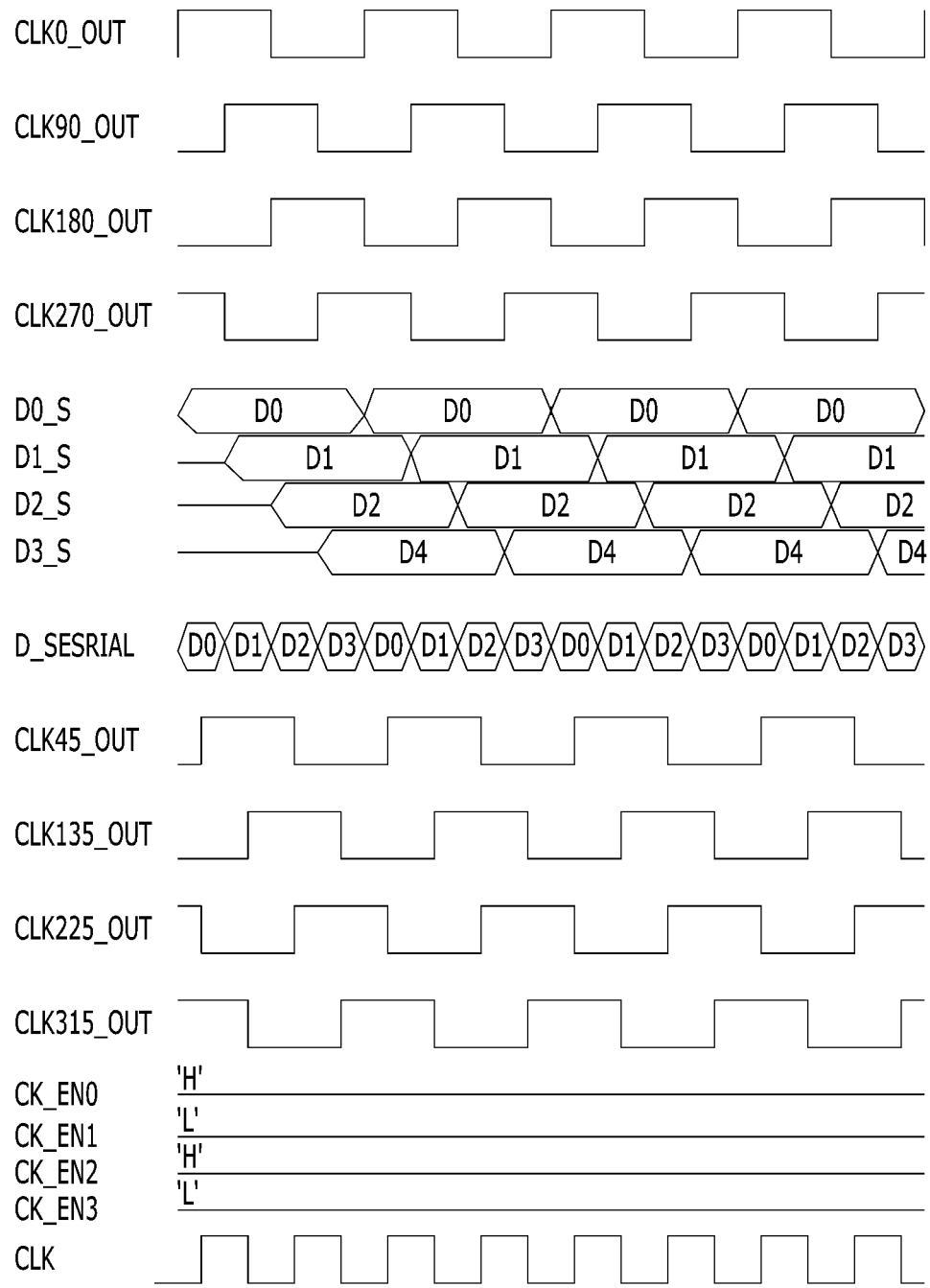
FIG. 11 is a timing diagram illustrating an operation of the integrated circuit 1000 of FIG. 10 in accordance with an embodiment of the present disclosure.

FIG. 11 is a timing diagram illustrating an operation of the integrated circuit 1000 of FIG. 10 in accordance with an embodiment of the present disclosure.

Referring to FIG. 11, the signal D0_S is aligned with the first phase alignment clock CLK0_OUT, and the signal D1_S is aligned with the second phase alignment clock CLK90_OUT, and the signal D2_S is aligned with the third phase the alignment clock CLK180_OUT, and the signal D3_S is aligned with the fourth phase alignment clock CLK270_OUT.

The serial signal D_SERIAL is generated by the parallel-to-serial conversion of the parallel signals D0_S to D3_S.

The rising edge and the falling edge of the clock CLK which is generated by parallel-to-serial converting the signals CK_EN0 to CK_EN3 based on the first to fourth phase strobing clocks CLK45_OUT, CLK135_OUT, CLK225_OUT, and CLK315_OUT are aligned with the center of the serial signal D_SERIAL. Herein, since the signals CK_EN0 and CK_EN2 are maintained to have a logic high level and the signals CK_EN1 and CK_EN3 are maintained to have a logic low level, the clock CLK may be in an activated state in which the clock CLK toggles continuously.

Referring to FIGS. 10 to 11, as the parallel signals D0 to D3 are aligned based on the first to fourth phase alignment clocks CLK0_OUT, CLK90_OUT, CLK180_OUT, and CLK270_OUT, the aligned parallel signals D0_S to D3_S may be transferred within the integrated circuit.

Also, the parallel signals D0_S to D3_S may be parallel-to-serial converted into serial signals D_SERIAL based on the first to fourth phase alignment clocks CLK0_OUT, CLK90_OUT, CLK180_OUT, and CLK270_OUT.

Also, it is possible to generate a clock CLK whose rising edge and falling edge are aligned with the center of the signals D0 to D3 of the serial signal D_SERIAL by parallel-to-serial converting the signals CK_EN0 to CK_EN3 based on the first to fourth phase strobing clocks CLK45_OUT, CLK135_OUT, CLK225_OUT, and CLK315_OUT. The clock CLK may be used for the integrated circuit to transfer and receive the serial signal D_SERIAL to and from another integrated circuit.

In accordance with the embodiments of the present disclosure, even in a case where two clocks to be synthesized are low-frequency clocks, the two clocks may be synthesized after making the two clocks in-phase.

Although various embodiments have been described for illustrative purposes, it will be apparent to those skilled in the art that various changes and modifications may be made without departing from the spirit and scope of the disclosure as defined in the following claims. Furthermore, the embodiments may be combined to form additional embodiments.

What is claimed is:
1. A clock generator circuit, comprising:
first to $N^{th}$ nodes, where N is an even number equal to or greater than 2; and
a parallel-to-serial conversion circuit suitable for parallel-to-serial converting signals of the first to $N^{th}$ nodes to output a clock through an output node,
wherein, in an activation section of the clock, the signals of even-numbered nodes among the first to $N^{th}$ nodes have a first level, and the signals of odd-numbered nodes among the first to N$^{th}$ nodes have a second level which is different from the first level, and wherein, in a deactivation section of the clock, the signals of the first to N$^{th}$ nodes have the same level.

2. The clock generator circuit of claim 1, wherein the parallel-to-serial conversion circuit parallel-to-serial converts the signal based on first to N$^{th}$ phase clocks having different phases.

3. The clock generator circuit of claim 1, wherein, in a deactivation section of the clock, the signals of the first to N$^{th}$ nodes have a logic low level.

4. The clock generator circuit of claim 2, wherein, when N is 4, a phase difference between the first phase clock and the second phase clock is 90 degrees, a phase difference between the second phase clock and the third phase clock is 90 degrees, and a phase difference between the third phase clock and the fourth phase clock is 90 degrees.

5. The clock generator circuit of claim 4, wherein the parallel-to-serial conversion circuit transfers:

the signal of the first node to the output node while the first phase clock has a logic high level and the second phase clock has a logic low level, the signal of the second node to the output node while the second phase clock has a logic high level and the third phase clock has a logic low level, the signal of the third node to the output node while the third phase clock has a logic high level and the fourth phase clock has a logic low level, and the signal of the fourth node to the output node while the fourth phase clock has a logic high level and the first phase clock has a logic low level.

6. An integrated circuit, comprising:

a phase interpolator suitable for generating first to N$^{th}$ phase alignment clocks where N is an even number equal to or greater than 2, having different phases and first to N$^{th}$ phase strobing clocks having different phases between the phases of the first to N$^{th}$ phase alignment clocks;

a signal alignment circuit suitable for aligning first to N$^{th}$ signals based on the first to N$^{th}$ phase alignment clocks;

a first parallel-to-serial conversion circuit suitable for parallel-to-serial converting the first to N$^{th}$ signals which are aligned by the signal alignment circuit, based on the first to N$^{th}$ phase alignment clocks and outputting a serial signal; and a second parallel-to-serial conversion circuit suitable for parallel-to-serial converting signals of first to N$^{th}$ nodes based on the first to N$^{th}$ phase strobing clocks and outputting a strobing clock.

7. The integrated circuit of claim 6, further comprising a clock activation controller suitable for supplying a voltage of a first level to even-numbered nodes among the first to N$^{th}$ nodes and supplying a voltage of a second level to odd-numbered nodes among the first to N$^{th}$ nodes in an activation section of the strobing clock, and supplying a voltage of the same level to the first to N$^{th}$ nodes in a deactivation section of the strobing clock.

8. The integrated circuit of claim 7, wherein in the deactivation section of the strobing clock, the first to N$^{th}$ nodes have a logic low level.

9. The integrated circuit of claim 7, wherein when N is 4, a phase difference between the first phase alignment clock and the second phase alignment clock is 90 degrees, a phase difference between the second phase alignment clock and the third phase alignment clock is 90 degrees, a phase difference between the third phase alignment clock and the fourth phase alignment clock is 90 degrees, a phase difference between the first phase strobing clock and the first phase alignment clock is 45 degrees, a phase difference between the second phase strobing clock and the second phase alignment clock is 45 degrees, a phase difference between the third phase strobing clock and the third phase alignment clock is 45 degrees, and a phase difference between the fourth phase strobing clock and the fourth phase alignment clock is 45 degrees.

10. The integrated circuit of claim 9, wherein the second parallel-to-serial conversion circuit transfers the signal of the first node to an output node while the first phase strobing clock has a logic high level and the second phase strobing clock has a logic low level, the signal of a second node to the output node while the second phase strobing clock has a logic high level and the third phase strobing clock has a logic low level, the signal of a third node to the output node while the third phase strobing clock has a logic high level and the fourth phase strobing clock has a logic low level, and the signal of a fourth node to the output node while the fourth phase strobing clock has a logic high level and the first phase strobing clock has a logic low level.

11. The integrated circuit of claim 9, wherein the first parallel-to-serial conversion circuit outputs the first signal as the serial signal while the first phase alignment clock has a logic high level and the second phase alignment clock has a logic low level, the second signal as the serial signal while the second phase alignment clock has a logic high level and the third phase alignment clock has a logic low level, the third signal as the serial signal while the third phase alignment clock has a logic high level and the fourth phase alignment clock has a logic low level, and the fourth signal as the serial signal while the fourth phase alignment clock has a logic high level and the first phase alignment clock has a logic low level.

12. The integrated circuit of claim 9, wherein the phase interpolator includes:

a first delay line having a delay value adjusted based on a delay control code and suitable for delaying a first input clock;

a delay control circuit suitable for generating the delay control code by comparing a phase of the first input clock delayed by the first delay line with a phase of a second input clock;

a first driver suitable for outputting the first input clock delayed by the first delay line as the first phase alignment clock;

a first combining unit suitable for driving the first input clock delayed by the first delay line and the second input clock to the first node;

a second delay line having a delay value adjusted based on the delay control code and suitable for delaying the clock of the first node and outputting the first phase strobing clock, the delay value of the second delay line being a half of the delay value of the first delay line;

a second driver suitable for transferring the second input clock to the second node; and a third delay line having a delay value adjusted based on the delay control code and suitable for delaying the clock of the second node and outputting the second phase alignment clock, the delay of the third delay line being the same as the delay value of the first delay line.

13. The integrated circuit of claim 12, wherein the phase interpolator further includes:
a fourth delay line having a delay value adjusted based on the delay control code and suitable for delaying the second input clock, the delay value of the fourth delay line being the same as the delay value of the first delay line;
a second combining unit suitable for driving the second input clock delayed by the fourth delay line and the third input clock to the third node;
a fifth delay line having a delay value adjusted based on the delay control code and suitable for delaying the clock of the third node and outputting the second phase strobing clock, the delay value of the fifth delay line being a half of the delay value of the first delay line;
a third driver suitable for transferring the third input clock to the fourth node; and
a sixth delay line having a delay value adjusted based on the delay control code and suitable for delaying the clock of the fourth node and outputting the third phase alignment clock, the delay value of the sixth delay line being the same as the delay value of the first delay line.

14. The integrated circuit of claim 13, wherein the phase interpolator further includes:
a seventh delay line having a delay value adjusted based on the delay control code and suitable for delaying the third input clock, the delay value of the seventh delay line being the same as the delay value of the first delay line;
a third combining unit suitable for driving the third input clock delayed by the seventh delay line and the fourth input clock to a fifth node;
an eighth delay line having a delay value adjusted based on the delay control code and suitable for delaying the clock of the fifth node and outputting the third phase strobing clock, the delay value of the eighth delay line being a half of the delay value of the first delay line;
a fourth driver suitable for transferring the fourth input clock to a sixth node; and
a ninth delay line having a delay value adjusted based on the delay control code and suitable for delaying the clock of the sixth node and outputting the fourth phase alignment clock, the delay value of the ninth delay line being the same as the delay value of the first delay line.

15. The integrated circuit of claim 14, wherein the phase interpolator further includes:
a $10^{th}$ delay line having a delay value adjusted based on the delay control code and suitable for delaying the fourth input clock, the delay value of the $10^{th}$ delay line being the same as the delay value of the first delay line;
a fourth combining unit suitable for driving the fourth input clock delayed by the $10^{th}$ delay line and the first input clock to a seventh node; and
an $11^{th}$ delay line having a delay value adjusted based on the delay control code and suitable for delaying the clock of the seventh node and outputting an output clock, the delay value of the $11^{th}$ delay line being a half of the delay value of the first delay line.

16. A method comprising:
generating an even number of alignment clocks and an even number of strobing clocks, the respective alignment clocks and the respective strobing clocks alternately having an equal phase difference;
parallel-to-serial converting parallel signals based on the alignment clocks to output a serial signal; and
parallel-to-serial converting an even number of node signals based on the strobing clocks to output a resultant clock,
wherein a level of even ones of the node signals and a level of odd ones of the node signals are different from each other while the resultant clock is activated, and
wherein the levels are a logic low level while the resultant clock is deactivated.

17. The method of claim 16,
wherein the node signals are first to fourth node signals,
wherein the strobing clocks are first to fourth strobing clocks, and
wherein the parallel-to-serial converting of the node signals includes outputting as the resultant clock:
the first node signal while the first strobing clock has a logic high level and the second strobing clock has a logic low level,
the second node signal while the second strobing clock has a logic high level and the third strobing clock has a logic low level,
the third node signal while the third strobing clock has a logic high level and the fourth strobing clock has a logic low level, and
the fourth node signal while the fourth strobing clock has a logic high level and the first strobing clock has a logic low level.

* * * * *